United States Patent [19]

Hemmenway et al.

[11] Patent Number: 5,270,265
[45] Date of Patent: Dec. 14, 1993

[54] STRESS RELIEF TECHNIQUE OF REMOVING OXIDE FROM SURFACE OF TRENCH-PATTERNED SEMICONDUCTOR-ON-INSULATOR STRUCTURE

[75] Inventors: Donald F. Hemmenway; Stephen J. Gaul; Chris A. McCarty, all of Melbourne, Fla.

[73] Assignee: Harris Corporation, Melbourne, Fla.

[21] Appl. No.: 939,115

[22] Filed: Sep. 1, 1992

[51] Int. Cl.$^5$ .......................................... H01L 21/465
[52] U.S. Cl. ..................................... 437/228; 437/21; 437/67; 437/78
[58] Field of Search ...................... 437/67, 228, 21, 69, 437/78; 357/34; 156/643, 653

[56] References Cited

U.S. PATENT DOCUMENTS

| | | | |
|---|---|---|---|
| 4,847,214 | 7/1989 | Robb et al. | 437/67 |
| 5,095,351 | 3/1992 | Gotou | 357/34 |
| 5,137,837 | 8/1992 | Chang et al. | 437/67 |

OTHER PUBLICATIONS

"A Trench Isolated SOI Bipolar Process", 1990 IEEE SOI/SOS Conference by David Shain and Rob Badilo, pp. 83–84.

*Primary Examiner*—Olik Chaudhuri
*Assistant Examiner*—H. Jey Tsai
*Attorney, Agent, or Firm*—Charles E. Wands

[57] ABSTRACT

Creation of structural defects in a trench-isolated island structure is obviated by protecting the bottom of the trench pattern during etching of the hard mask surface oxide. A layer of photoresist is non-selectively deposited on the hard mask oxide layer and in the trench pattern, so that the photoresist buffer layer fills the trench pattern and is formed atop the hard mask oxide layer. The deposited photoresist is controllably flood-irradiated, so as to expose the irradiated photoresist down to a depth in the trench pattern that is at or somewhat deeper than the surface of the hard mask insulating material. The exposed photoresist is then developed, so as to remove the irradiated depth portion of the photoresist lying atop the hard mask oxide layer and partially extending into the trench, thus exposing the hard mask oxide layer, but leaving a sufficient quantity of unexposed photoresist in the trench pattern that provides a surface barrier for the underlying oxide. A wet etch is then non-selectively applied to the hard mask oxide layer, so as to completely remove the hard mask oxide layer from the top surface of the semiconductor islands. Because of the barrier in the bottom of the trench pattern, the oxide etch does not attack the underlying oxide. The undeveloped photoresist is then stripped. Thereafter, when the sidewalls of the trench pattern are oxidized and the trench pattern is filled with material, lattice dislocations are not formed in the islands.

12 Claims, 3 Drawing Sheets

STRESS RELIEF TECHNIQUE OF REMOVING OXIDE FROM SURFACE OF TRENCH-PATTERNED SEMICONDUCTOR-ON-INSULATOR STRUCTURE

FIELD OF THE INVENTION

The present invention relates in general to material treatment technology, such as the manufacture of integrated circuits, and is particularly directed to a process for forming a polysilicon-filled, trench-isolated, semiconductor-on-insulator structure without causing, in the course of surface oxide removal, undercutting of trench isolated islands at their interfaces with underlying insulator material, so that subsequent refill of the trench pattern does not create stress regions in the semiconductor islands.

BACKGROUND OF THE INVENTION

In a variety of manufacturing processes, such as those which form multilayer structures, it may be necessary to subject a prescribed portion of a structure to a selective treatment operation, such as polishing or material removal. Where the nature of the process involves a general exposure of the structure to a material modifying agent, such as a wet etch, polishing slurry, etc. in order to remove a particular material, such as a top layer, the material modifying agent may also attack other portions of the structure, modification of the physical characteristics of which may detrimentally affect the intended configuration of the structure.

As an illustration of this problem, consider the case of semiconductor manufacturing processes in which trench isolation technology is employed to form a plurality of dielectrically isolated semiconductor islands that lie atop an insulator (oxide) layer (which, in turn, is supported on an underlying support handle wafer or substrate). As diagrammatically illustrated in FIG. 1, the trench formation may employ a silicon dioxide layer 11 as a mask material (as opposed to using photoresist as the mask material), the oxide 'hard' mask layer 11 overlying the top surface 13 of semiconductor islands 15. This 'hard' oxide mask is eventually removed by non-selectively exposing the structure of FIG. 1 to a wet oxide etch.

Unfortunately, as shown in FIG. 2, during this surface oxide etch step, a buried oxide layer 21, upon which the trench-patterned islands 15 are disposed, is subjected to attack by the 'hard' oxide removal mechanism (the non-selectively applied oxide etch bath). Namely, in the course of removing the mask oxide from the top surface of the semiconductor island, the oxide etch also enters the trenches and attacks the buried oxide layer 21 at the bottom of the trench pattern, thereby undesirably etching this buried oxide in such a manner as to cause undercutting of the sidewalls 23 of the trench pattern, leaving an overhang or 'lip' 25 of island material at the bottom of the trench.

When a dielectric (oxide) layer 31 is subsequently formed on the trench sidewalls and the trench is thereafter refilled with material (typically doped or undoped polysilicon) 33, as shown in FIG. 3, a high stress region is induced at the undercut portion of the islands, leading to dislocation-type defects shown by dotted lines 41. These defects propagate along <111> planes in the silicon lattice of the islands. It is believed that a vertical strain is created (normal to the buried oxide surface) by thermal mismatch between the trench refill material 33 or by 'bird's beaking' during trench isolation formation of the dielectric (oxide) layer 31. This strain is relieved along the <111> planes, resulting in the lattice dislocations 41.

SUMMARY OF THE INVENTION

In accordance with the present invention, the undesirable modification of the physical characteristics of a material within a trench-isolated structure, such as the creation of structural defects in the trench-isolated island structure as a result of oxide etch undercutting of the islands, is effectively obviated by protecting the bottom of the trench pattern during etching of the hard mask oxide, and thereafter removing the protection material by a wash that does not attack the underlying oxide, so that the islands are not undercut and no stress defects are induced.

For this purpose, a layer of buffer material, such as a positive photoresist, is non-selectively deposited on the hard mask oxide layer and in the trench pattern, so that the positive photoresist buffer layer fills the trench pattern and is formed atop the hard mask oxide layer. The deposited photoresist is controllably flood-irradiated, so as to expose the photoresist down to a depth in the trench pattern that is deeper than the surface of the hard mask oxide, but less than the depth of the trench pattern. The exposed photoresist is then developed, so as to remove the irradiated depth portion of the photoresist lying atop the hard mask oxide layer and partially extending into the trench, thus exposing the hard mask oxide layer, but leaving a sufficient quantity of unexposed photoresist in the trench pattern that provides a surface barrier for the underlying oxide. A wet etch is then non-selectively applied to the hard mask oxide layer, so as to completely remove the hard mask oxide layer from the top surface of the semiconductor islands. Because of the presence of the unexposed photoresist barrier at the bottom of the trench pattern, the oxide etch does not attack the underlying oxide. The unexposed photoresist is then removed by means of a photoresist wash to which the underlying oxide layer is impervious.

Thereafter, when the sidewalls of the trench pattern are oxidized and the trench pattern is filled with conductive material such as (doped or undoped) polysilicon, since there is no undercut cavity beneath the islands, there is no region to induce the previously mentioned vertical strain by thermal mismatch between the trench refill material or by 'bird's beaking' during trench isolation to form the dielectric (oxide) layer, whereby lattice dislocations that serve to relieve the strain are not formed in the islands.

DETAILED DESCRIPTION

FIGS. 4-9 diagrammatically illustrate, in cross-section, a silicon-on-insulator architecture, having a plurality of dielectrically isolated islands distributed in accordance with a prescribed trench pattern, at respective steps of manufacture in accordance the methodology of the present invention.

Figure 1:
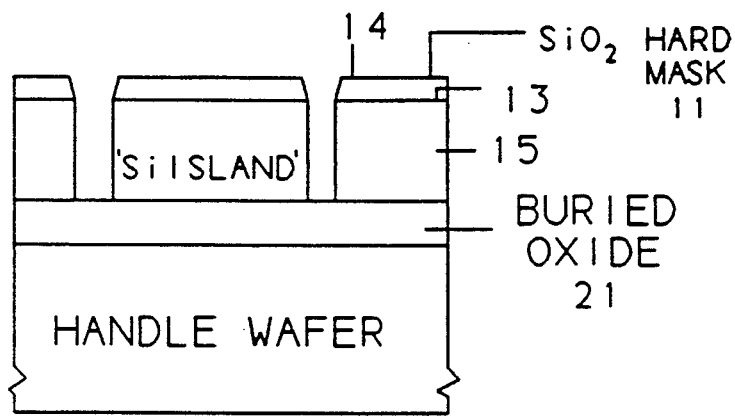
FIG. 1 diagrammatically illustrates a semiconductor structure having an oxide layer (hard mask) that overlies the top surface of trench isolated semiconductor islands.
Figure 2:
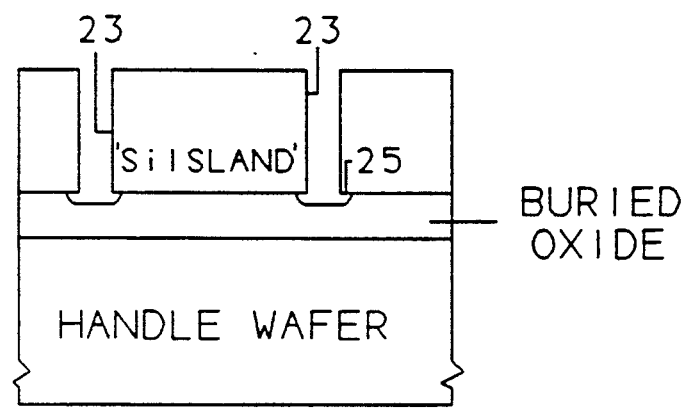
FIG. 2 shows the manner in which a buried oxide layer upon which the trench-patterned islands of FIG. 1 are disposed is attacked by an oxide etch bath, thereby undercutting sidewalls of the trench pattern.
Figure 4:
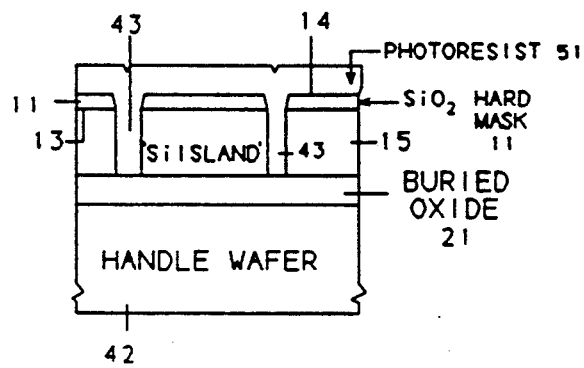
FIGS. 4-9 diagrammatically illustrate, in cross-section, a silicon-on-insulator architecture, having a plurality of dielectrically isolated islands distributed in accordance with a prescribed trench pattern, at respective steps of manufacture in accordance the methodology of the present invention.

FIG. 4 illustrates a silicon-on-insulator architecture, such as that shown in FIG. 1, described above, having an oxide mask (hard mask) layer 11 overlying the top surfaces 13 of a plurality of semiconductor islands 15. The islands themselves are disposed on a buried oxide layer 21 which, in turn, is supported by an underlying 'handle' wafer 42. It should be observed that the choice of materials for hard mask layer 11 and/or buried layer 21 is not limited to silicon dioxide. Other materials, such as diamond and silicon nitride, for example, may be employed. In addition the hard mask layer 11 and the buried layer 21 may be dissimilar materials. Moreover, substrate 42 may comprise a material other that silicon. In the case of a semiconductor structure, other materials such as GaAs may be used. Further, the substrate is not limited to a crystalline structure or a particular doping type or impurity concentration.

The islands are partitioned or separated from one another by a trench pattern 43, which extends from the top surface 14 of the oxide layer 11 down to the surface of the buried oxide layer 21. In accordance with the present invention, a precursor step to etching away the oxide mask 11 is the formation of a protective barrier or buffer material in the bottom of the trench pattern, so that the underlying buried oxide 21 will not be exposed to the etch bath employed to remove the oxide 11. For this purpose, a layer of buffer material, such as positive photoresist 51, is non-selectively deposited on oxide layer 11 and in the trench pattern 43, so that the positive photoresist buffer layer fills the trench pattern and is formed atop the oxide layer 11.

Figure 5:
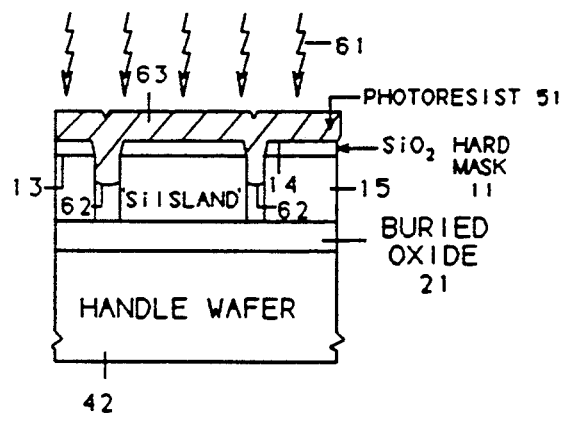

The deposited photoresist is then controllably flood-irradiated with an irradiation source whose energy output is chosen such that the depth of penetration of the photon energy 61 into the photoresist reaches a depth 62 in the trench pattern that is at or below the surface 14 of the oxide layer 11, as shown by the cross-hatching 63 in FIG. 5.

Figure 6:
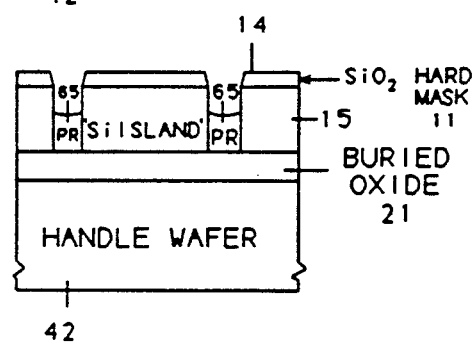

The exposed layer of photoresist 51 is then developed, as shown in FIG. 6, so as to remove the irradiated depth portion 63 of the photoresist lying atop the oxide layer 11 and partially extending into the trench. The oxide mask layer 11 is now exposed; however, the lower portion of the trench pattern 43 retains a sufficient quantity of unexposed photoresist 65 that provides a surface barrier for the underlying oxide 21.

Figure 7:
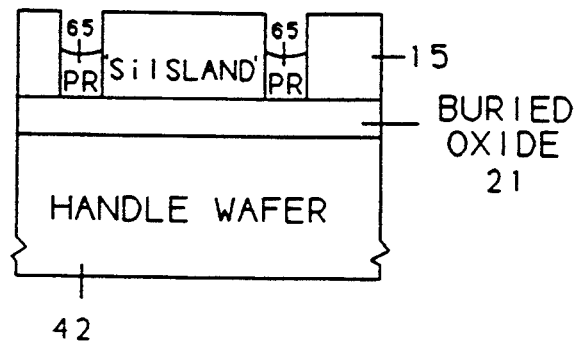
Figure 8:
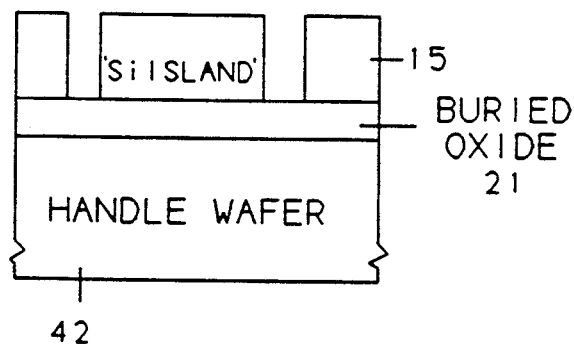

Following development of the exposed photoresist 63, a wet oxide etch is non-selectively applied to the structure shown in FIG. 6, so as to completely remove oxide layer 11 from the top surfaces 13 of the semiconductor islands 15, as shown in FIG. 7. Because of the presence of the unexposed photoresist barrier 65 at the bottom of the trench pattern, the oxide etch does not attack the underlying oxide 21. The remaining unexposed photoresist 65 is then removed by means of a photoresist wash to which the underlying oxide layer is impervious, to obtain a 'clean' trench-patterned structure, as shown in FIG. 8.

In the foregoing example, the only limitation on the choice of buffer material 51 is that it be selective with respect to the materials that are used for the 'hard' mask layer 11 and the buried layer 21 (oxides in the present example) and the surface treatment (oxide etch in the present example). For example, silicon nitride may be used in place of photoresist and polish planarization used in place of an oxide etch in order to remove a layer of silicon nitride overlying the hard mask.

Moreover, alternate methods of removing the buffer material overlying the hard mask may be employed. For example, an etch back method using reactive ion etching or plasma etching may be employed in place of the above described photoresist, develop technique. Polishing or grinding may be used to remove the buffer material from the top surface. In addition, even though the present example describes the use of a 'positive' photoresist buffer layer, it should be observed that a negative photoresist material may be used. For negative photoresist, the flood exposure step is omitted, and the surface buffer material is removed using a controlled resist develop process.

Figure 9:
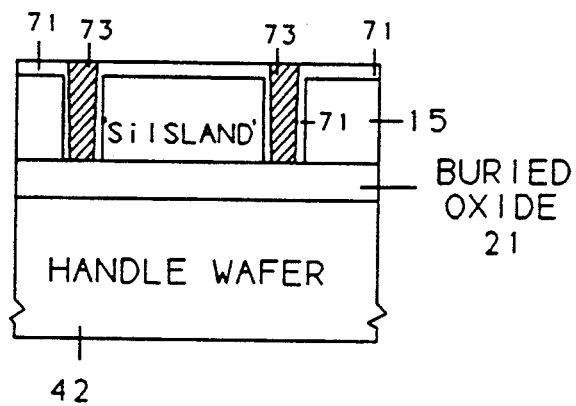

Thereafter, as shown in FIG. 9, the sidewalls of the trench pattern are coated with a dielectric (oxide) layer 71 and the dielectrically coated trench pattern is filled with material such as, but not limited to doped or undoped polysilicon 73. (The buffer/protect layer may be used as part of the trench refill).

Figure 3:
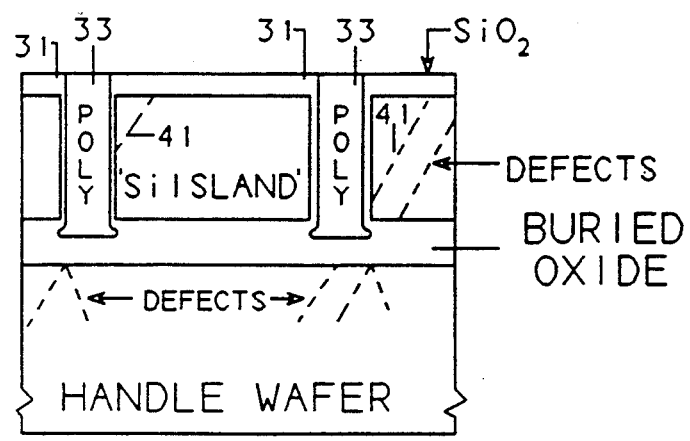
FIG. 3 shows the creation of a high stress region at an undercut portion of an island, leading to dislocation-type defects.

It is to be observed that there is no undercut region beneath the islands 15, as shown in FIG. 3, so that there is no region to induce vertical strain by thermal mismatch between the trench refill material 73 or by 'bird's beaking' during trench isolation to form dielectric (oxide) layer 71. Therefore, lattice dislocations are not formed in the islands.

The surface treatment of the present example (an oxide etch) is not limited to removal of the hard mask. The surface treatment may also involve a further oxidation which must not be applied to the buried layer 21. Additionally, after removal of the hard mask layer 11, other treatment of the structure may be carried out prior to removal of the protective buffer layer. Such treatment steps may include ion-implantation, anodization, etching, photoresist masking operations, metalization, etc. (In the present example, the buffer layer keeps the trench sidewalls and trench bottom from being affected by the further treatment.)

As will be appreciated from the foregoing description of the present invention, creation of structural defects in a trench-isolated island structure as a result oxide etch undercutting that occurs when the buried oxide layer is exposed to the etch wash used to remove a topside oxide mask is effectively obviated by protecting the bottom of the trench pattern during etching of the surface oxide with a readily controllable thickness of photoresist. After the oxide mask etch, the barrier layer of photoresist is easily removed by a wash that does not attack the underlying oxide, so that the islands are not undercut and no stress defects are induced.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A method of manufacturing a semiconductor-on-insulator structure comprising the steps of:
   (a) providing a support layer on which an insulator layer is formed and a semiconductor layer formed atop said insulator layer;
   (b) selectively forming a trench pattern-defining masking layer on a top surface of said semiconductor layer, said masking layer exposing a selected portion of said top surface of said semiconductor layer;
   (c) using the masking layer formed in step (b), removing material from said semiconductor layer exposed by said masking layer, so as to form a trench pattern in said semiconductor layer that extends from the top surface of said semiconductor layer down to said insulator layer, so that sidewalls of said trench pattern expose semiconductor material of said semiconductor layer and said insulator layer therebeneath; and
   (d) subjecting said masking layer to the application of a non-selective surface treatment agent so as to remove said masking layer from said semiconductor layer, said subjecting step comprising:
   (d1) the preliminary step of selectively forming, only in said trench pattern, buffer material that covers the insulator layer exposed by said trench pattern and protects said insulator layer against the action of said surface treatment agent, while leaving said masking layer on said top surface of said semiconductor layer, and thereafter,
   (d2) non-selectively applying said surface treatment agent to the structure resulting from step (d1), so that said surface treatment agent removes said masking material from the top surface of said patterned semiconductor layer, yet is prevented from attacking the bottom of said trench pattern because of the presence of said buffer material therein.

2. A method according to claim 1, wherein step (d1) comprises non-selectively depositing photoresist on said masking layer and in said trench pattern, so that said photoresist fills said trench pattern and is formed atop said masking layer, controllably irradiating the deposited photoresist so as to expose the irradiated photoresist down to a depth in said trench pattern deeper than the top surface of said semiconductor layer on which said masking layer has been formed but not the full depth of said trench, and developing the exposed photoresist, so as to remove that portion of said photoresist that lies atop said masking layer, thereby exposing said masking layer, but leaving unexposed photoresist in and covering the bottom of said trench pattern in said semiconductor layer.

3. A method according to claim 1, wherein step (d2) comprises non-selectively applying an etchant to the structure obtained by step (d1), said etchant etching said masking layer from the top surface of said semiconductor layer, while being prevented from attacking the bottom of said trench pattern in said semiconductor layer due to the presence of said unexposed photoresist thereon.

4. A method according to claim 3, further including the step of (e) removing the unexposed photoresist from the bottom of said trench pattern, thereby exposing said insulator layer.

5. A method according to claim 4, further including the step of (f) filling the trench pattern, from which unexposed photoresist has been removed in step (e), with conductive material.

6. A method according to claim 1, wherein step (d1) comprises
   (d1-1) non-selectively depositing buffer material on said insulator layer and in said trench pattern, so that said buffer material fills said trench pattern and is formed atop said masking layer, and
   (d1-2) controllably removing said buffer material down to a depth that extends into said trench pattern deeper than the top surface of said semiconductor layer, thereby exposing said masking layer, but leaving buffer material in said trench pattern covering the bottom of said trench pattern in said semiconductor layer.

7. A method according to claim 1, wherein each of said masking layer and said insulator layer comprises an oxide layer.

8. A method of manufacturing a semiconductor-on-insulator structure comprising the steps of:
   (a) providing a support layer on which an insulator layer is formed and a semiconductor layer formed atop said insulator layer;
   (b) selectively forming a trench pattern-defining masking layer on a top surface of said semiconductor layer, said masking layer exposing a selected portion of said top surface of said semiconductor layer;
   (c) using the masking layer formed in step (b), removing material from said semiconductor layer exposed by said masking layer, so as to form a trench pattern in said semiconductor layer that extends from the top surface of said semiconductor layer down to said insulator layer, so that sidewalls of said trench pattern expose semiconductor material of said semiconductor layer and said insulator layer therebeneath; and
   (d) performing a masking layer-removal, trench fill process in such a manner as to fill said trench pattern with material capable of providing a conductive path through said trench pattern, while preventing the formation of stress-inducing, dislocation-type defects in the vicinity of the interface between sidewalls of said trench pattern in said semiconductor layer and said insulator layer therebeneath, said trench fill process performing step comprising the steps of
   (d1) subjecting said masking layer to the application of a non-selective surface treatment agent so as to remove said masking layer from said semiconductor layer, said subjecting step including the steps of
   (d1-1) the preliminary step of selectively forming, in said trench pattern, buffer material that covers the insulator layer exposed by said trench pattern and protects said insulator layer against the action of said surface treatment agent, and thereafter,
   (d1-2) non-selectively applying said surface treatment agent to the structure resulting from step (d1), so that said surface treatment agent removes said masking material from the top surface of said patterned semiconductor layer, yet is prevented from attacking the bottom of said trench pattern because of the presence of said buffer material therein, (d2) removing buffer material from the bottom of said trench pattern, (d3) forming dielectric material along sidewalls of said semiconductor layer exposed by the removal of said buffer material, and (d4) filling the remainder of said trench pattern with said material capable of providing a conductive path through said trench pattern that is insulated from said semiconductor layer by dielectric material formed in step (d3).

9. A method according to claim 8, wherein step (d1-1) comprises non-selectively depositing photoresist on said masking layer and in said trench pattern, so that said photoresist fills said trench pattern and is formed atop said masking layer, controllably irradiating the deposited photoresist so as to expose the irradiated photoresist down to a depth in said trench pattern deeper than the top surface of said semiconductor layer on which said masking layer has been formed but not the full depth of said trench, and developing the exposed photoresist, so as to remove that portion of said photoresist that lies atop said masking layer, thereby exposing said masking layer, but leaving unexposed photoresist in and covering the bottom of said trench pattern in said semiconductor layer.

10. A method according to claim 8, wherein step (d1-2) comprises non-selectively applying an etchant to the structure obtained by step (d1-1), said etchant said masking layer from the top surface of said semiconductor layer, while being prevented from attacking the bottom of said trench pattern in said semiconductor layer due to the presence of said unexposed photoresist thereon.

11. A method according to claim 10, wherein step (d1-1) comprises non-selectively depositing buffer material on said insulator layer and in said trench pattern, so that said buffer material fills said trench pattern and is formed atop said masking layer, and controllably removing said buffer material down to a depth that extends into said trench pattern deeper than the top surface of said semiconductor layer, thereby exposing said masking layer, but leaving buffer material in said trench pattern covering the bottom of said trench pattern in said semiconductor layer.

12. A method according to claim 8, wherein each of said masking layer and said insulator layer comprises an oxide layer.

* * * * *